United States Patent
Leasure et al.

(10) Patent No.: US 6,236,253 B1
(45) Date of Patent: May 22, 2001

(54) APPARATUS AND METHOD FOR CONTROLLING A RESET IN A SELF-TIMED CIRCUIT OF A MULTIPLE-CLOCK SYSTEM

(75) Inventors: Terry Lee Leasure, Georgetown; Jose Angel Paredes, Austin, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/428,408

(22) Filed: Oct. 28, 1999

(51) Int. Cl.[7] .................................................... H03K 3/02
(52) U.S. Cl. .............................................. 327/198; 327/212
(58) Field of Search .................................. 327/51, 55–57, 327/99, 144, 166, 176, 198, 201, 210–215, 225

(56) References Cited

U.S. PATENT DOCUMENTS

| | | | |
|---|---|---|---|
| 5,867,049 | * | 2/1999 | Mohd ................................... 327/200 |
| 5,900,759 | * | 5/1999 | Tam ..................................... 327/201 |
| 5,942,919 | * | 8/1999 | Ang et al. ............................. 327/57 |
| 6,144,237 | * | 11/2000 | Ikezaki ................................. 327/143 |

* cited by examiner

*Primary Examiner*—My-Trang Nuton
(74) *Attorney, Agent, or Firm*—Russell D. Culbertson; Shaffer & Culbertson, LLP; Casimer K. Salys

(57) ABSTRACT

A first latch circuit (15) and a control latch circuit (16) are used to control another circuit (18) in a self-timed circuit arrangement (10). The first latch circuit (15) produces a first latch circuit output signal (L1) responsive to a first clock signal (C1) in a multiple-clock system. The control latch circuit (16) responds to the second clock signal (C2) to latch the first latch output signal (L1) and produce a reset control signal which is used to produce both a reset signal (RE) and a control output signal (L2). The reset signal (RE) resets the first latch circuit (15), while the control output signal (L2) may be used to control the other circuit (18) even after the first latch circuit is reset.

20 Claims, 3 Drawing Sheets

APPARATUS AND METHOD FOR CONTROLLING A RESET IN A SELF-TIMED CIRCUIT OF A MULTIPLE-CLOCK SYSTEM

TECHNICAL FIELD OF THE INVENTION

This invention relates to electronic circuits, and particularly to self-timed circuits used in digital processing systems. The invention encompasses both an apparatus and method for controlling a reset in a self-timed circuit.

BACKGROUND OF THE INVENTION

An operation in an integrated circuit may be initiated following a certain delay after the occurrence of some triggering event. In digital processing systems, for example, a sense amplifier may be enabled to read data from a random access memory array after a delay measured from the activation of the word lines in the memory array. This type of circuit, in which one portion of the circuit is controlled by another portion in response to some triggering event, is commonly referred to as a self-timed circuit. Many types of circuits used in digital processors are commonly implemented as self-timed circuits.

Self-timed circuits are difficult to implement in certain cases. A multiple-clock system in which the clock signals may be underlapped presents one instance in which a self-timed circuit is difficult to implement. In an underlapped condition, a first clock signal ends before a second clock signal appears. If, for example, the first clock signal is used as an event to initiate the operation of a self-timed circuit, and if the result from the self-timed circuit must be available during the second clock signal, some mechanism must be employed to maintain the result from the self-timed circuit after the end of the first clock signal. That is, the result from the self-timed circuit must be maintained until some point after the second clock signal appears.

Properly maintaining the result from a self-timed circuit for a sufficient period of time is not a trivial task because the delay must allow for process variations. Simply gating the output from the self-timed circuit with the second clock signal would ensure that the self-timed circuit output was available during the second clock signal. However, gating the signal from the self-timed circuit with the second clock signal would at least slow the operation performed by the self-timed circuit.

SUMMARY OF THE INVENTION

It is an object of the invention to provide an apparatus and method for overcoming the above-described problems and others associated with self-timed circuits. In particular, it is an object of the invention to provide an apparatus and method for controlling the reset in a self-timed circuit such that the circuit is insensitive to an underlapped clock condition in a multiple-clock system.

An apparatus according to the invention utilizes a first latch circuit and a control latch circuit to control an additional circuit, such as a sense amplifier for example. The control latch circuit produces a reset control signal which is used to produce both a reset signal and a control output signal. The reset signal resets the first latch circuit, while the control output signal may be used to control the additional circuit even after the first latch circuit is reset.

The first latch circuit latches an initial signal which is produced in response to a first clock signal. This first latched signal or first latch output signal provides an input to the control latch circuit along with the second clock signal. Upon receipt of the second clock signal, the control latch circuit latches the first latch output signal to produce the reset control signal. This reset control signal is delayed through a reset arrangement preferably comprising a series of inverter circuits to produce the reset signal for resetting the first latch circuit.

One alternate form of the invention further includes a fast path circuit. This fast path circuit receives the control output signal and the first latch output signal as its inputs and produces a fast path output signal when at least one of the input signals is active. Since the first latch output signal always becomes active prior to the control. output signal, the fast path output signal is available earlier for controlling the operation of another circuit. Also, the fast path output signal is stable throughout the duration of the second clock signal. Thus, the fast path output is ideally suited for use as a sense enable signal for a sense amplifier which has its outputs latched on the second clock signal. The fast path signal may appear early to enable the sense amplifier, and remains stable throughout a second clock to ensure the sense amplifier results are valid when latched. That is, the fast path output signal becomes active during the first clock signal and remains active until the second clock signal goes inactive. This is the case even when the first and second clocks are underlapped, with the first clock signal ending prior to the start of the second clock signal.

These and other objects, advantages, and features of the invention will be apparent from the following description of the preferred embodiments, considered along with the accompanying drawings.

DESCRIPTION OF THE PREFERRED EMBODIMENTS

Figure 1:
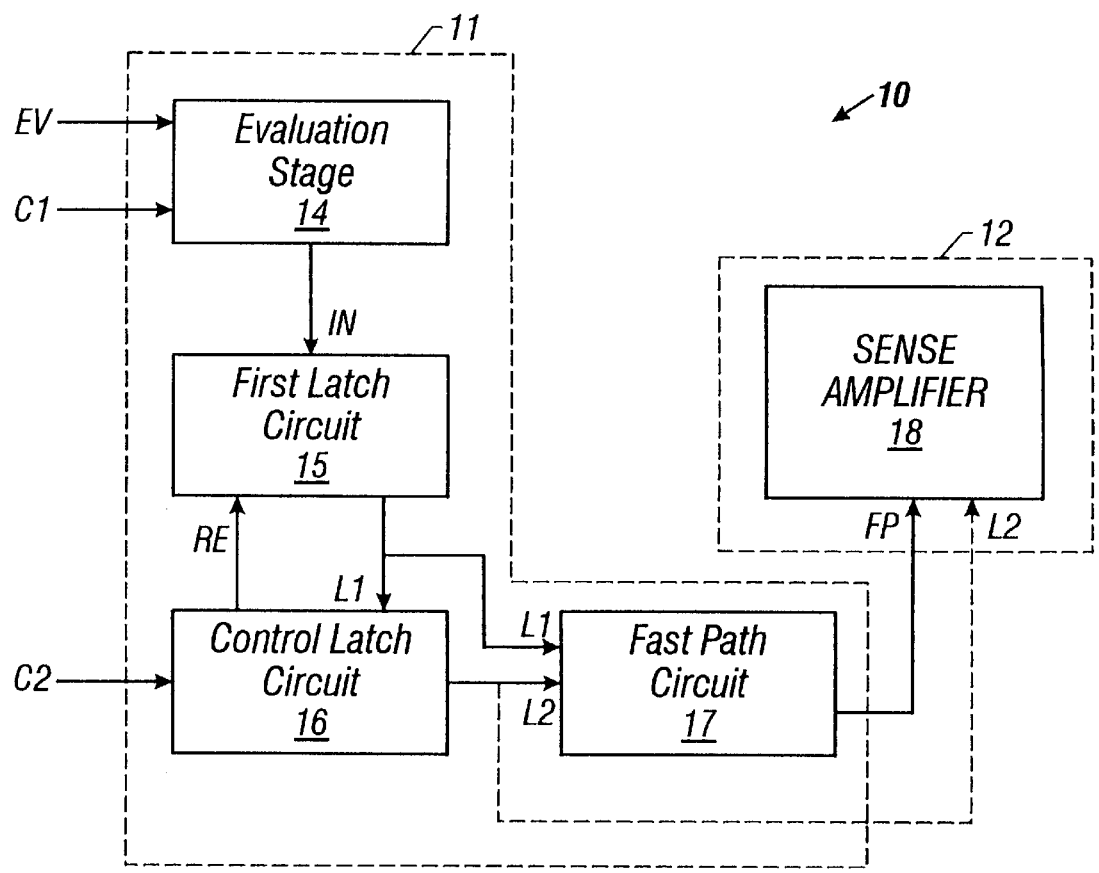
FIG. 1 is a diagrammatic representation of a self-timed circuit arrangement embodying the principles of the invention.

Referring to FIG. 1, self-timed circuit 10 includes a control portion shown in dashed box 11 and a controlled portion shown in dashed box 12. Control portion 11 includes an evaluation stage 14, first latch circuit 15, and second latch circuit 16. The form of the invention illustrated in FIG. 1 also includes a fast path circuit 17. A sense amplifier 18 comprises the controlled portion 12 of self-timed circuit 10. Those skilled in the art will appreciate that control portion 11 of self-timed circuit 10 may be used to control many other types of circuits other than the illustrated sense amplifier. Sense amplifier 18 is shown in FIG. 1 for purposes of describing the invention in connection with a common application of a self-timed circuit.

Evaluation stage 14 is adapted to evaluate the input EV in response to a first clock signal C1. This evaluation produces an initial output signal IN which is applied as an input to first latch circuit 15. First latch circuit 15 latches the initial signal IN to produce a first latch circuit output signal labeled L1 in the figures. This first latch circuit output signal L1 is applied as an input to second latch circuit 16 along with a second clock signal C2. In response to the second clock signal C2, second latch circuit 16 latches signal L1 to produce a reset control signal which will be described in detail below with reference to FIG. 4. This reset control signal is used to produce a reset signal RE and a control output signal L2. Signal RE serves to reset first latch circuit 15 while control output signal L2 may be used directly to control the operation of the controlled circuit, in this case the sense amplifier 18. Alternatively, control output signal L2 serves as an input to fast path circuit 17.

In the embodiment of the invention shown in FIG. 1, fast path circuit 17 is included to provide an earlier control signal as will be discussed in detail below. Fast path circuit 17 receives as inputs both the first latch output signal L1 and control output signal L2. In response to these input signals, fast path circuit 17 produces fast path output signal FP. This signal FP may be used to control the controlled circuit portion 12, in this case sense amplifier 18.

Figure 2:
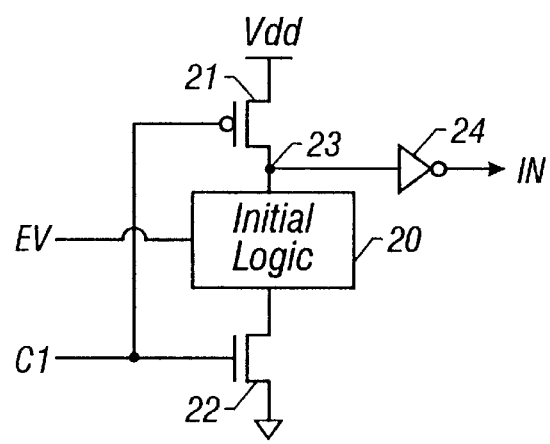
FIG. 2 is a schematic diagram showing the evaluation stage of FIG. 1.

Referring now to FIG. 2, evaluation stage 14 includes an evaluation logic arrangement 20 coupled between P-type transistor 21 and N-type transistor 22. Transistor 21 is connected to a supply voltage $V_{dd}$, while transistor 22 is connected to ground. The gate of each of these transistors is connected to receive first clock signal C1. The signal at evaluation node 23 is inverted through inverter circuit 24 to produce initial signal IN. In operation, evaluation logic arrangement 20 receives evaluation input EV, which may comprise any number of signals, and evaluates this input in response to first clock signal C1. Thus, evaluation stage 14 produces its output signal, the initial signal IN, in response to a favorable evaluation prompted by clock signal C1. It will be appreciated that evaluation logic 20 could use more than one signal in its evaluation. The single input EV is shown only for purposes of illustration and is not intended to limit the invention to a single evaluation input signal.

Figure 3:
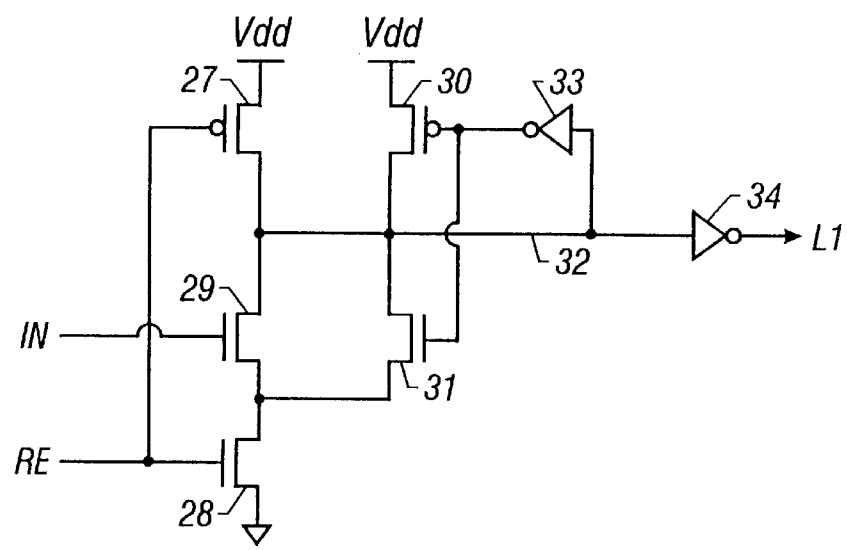
FIG. 3 is a schematic diagram of the first latch circuit of FIG. 1.

The preferred first latch circuit 15 shown in FIG. 3 comprises a feedback latch adapted to latch initial signal IN until reset by reset signal RE provided by control latch circuit 16. First latch circuit 15 includes P-type transistor 27 and N-type transistor 28 coupled between the supply voltage $V_{dd}$ and ground, in series with an input N-type transistor 29. The gates of transistors 27 and 28 are connected to receive reset signal RE, while the gate of transistor 29 is connected to receive initial signal IN. First latch circuit 15 also includes P-type transistor 30 and N-type transistor 31 coupled between the supply voltage $V_{dd}$ and ground through N-type transistor 28. An internal latch node 32 between transistors 27 and 29 is connected to the junction between transistors 30 and 31. The signal at this internal node 32 is fed back through inverter 33 to the gates of P-type transistor 30 and N-type transistor 31. The signal at internal node 32 is also inverted at output inverter 34 to provide first latch circuit output signal L1.

Figure 4:
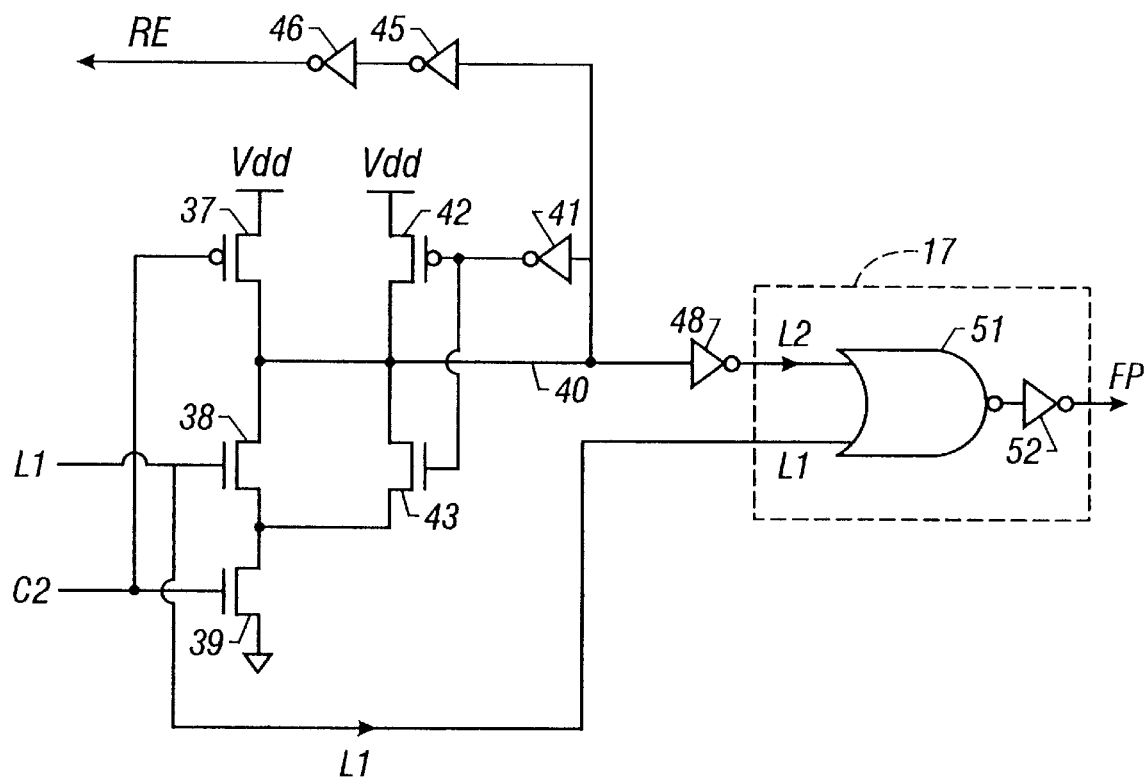
FIG. 4 is a schematic diagram of the control latch circuit and fast path circuit of FIG. 1.

Referring now to FIG. 4, control latch circuit 16 includes a latch structure similar to the feedback latch structure shown in FIG. 3. A P-type transistor 37, and two N-type transistors 38 and 39, are connected in series between the supply voltage $V_{dd}$ and ground. However, the gates of transistors 37 and 39 are connected to receive the second clock signal C2, and the gate of input N-type transistor 38 is connected to receive first latch circuit output signal L1. The signal at internal node 40 is fed back through inverter 41 to the gate of P-type transistor 42 and the gate of N-type transistor 43. Also, the signal at node 40 represents a reset control signal and is applied through a reset arrangement comprising inverters 45 and 46 to provide reset signal RE for first latch circuit 15. Further, output inverter 48 inverts the reset control signal at node 40 to produce control output signal L2.

FIG. 4 also shows the preferred structure of fast path circuit 17. In addition to providing an input to control latch circuit 16, the first latch circuit output signal L1 is also applied as an input to fast path circuit 17 shown in the dashed box in FIG. 4. Control output signal L2 provides the other input to the fast path circuit. The fast path circuit 17 provides an OR operation on the two inputs, and is preferably implemented in CMOS circuitry as a NOR gate 51 connected to apply its output to inverter 52. The fast path output FP is taken from the output of inverter 52. Those skilled in the art will appreciate that the NOR gate and inverter arrangement shown in FIG. 4 is only one example of a circuit arrangement which provides an OR function on two inputs. Any suitable ORing arrangement may be used alternatively to the illustrated example.

Figure 5:
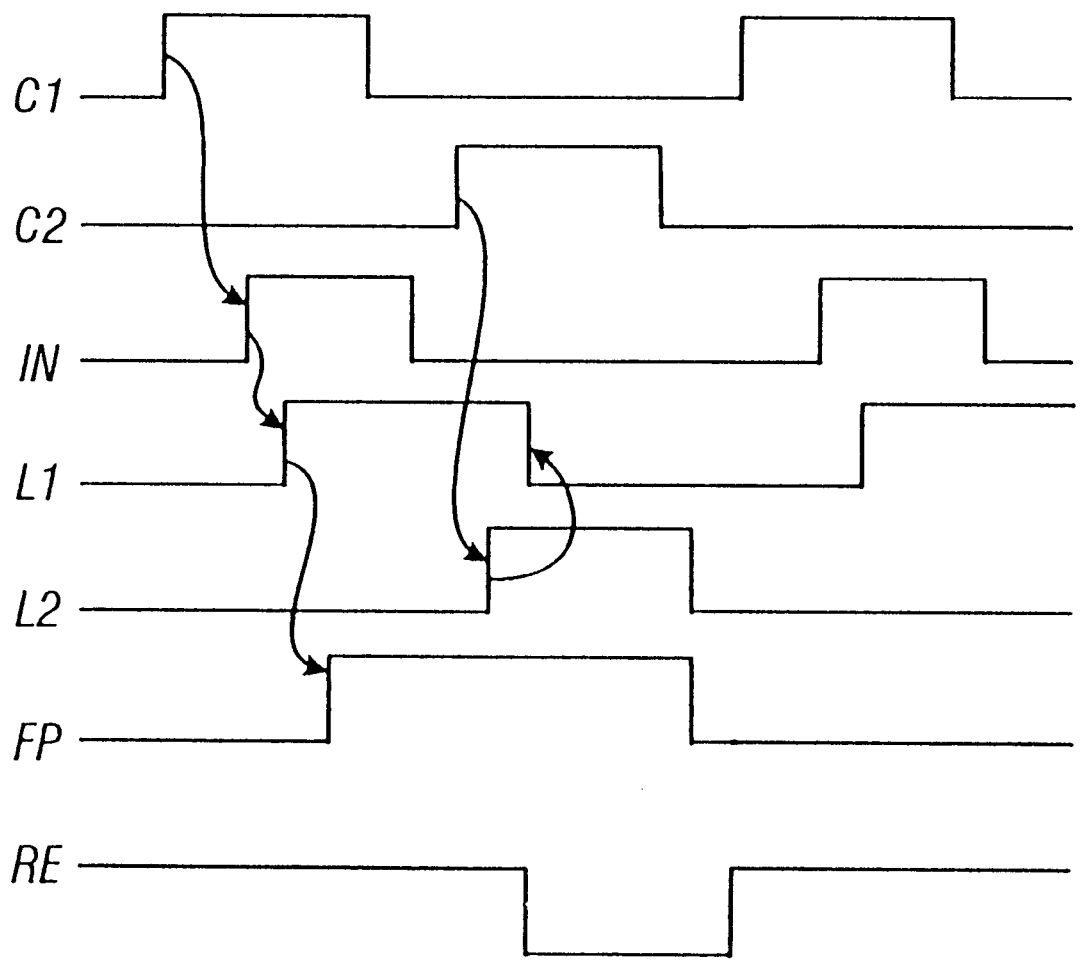
FIG. 5 is a timing diagram showing the timing of signals in the circuits shown in FIGS. 1 through 4.

The operation of the control portion 11 of self-timed circuit 10 may be described now with reference to the timing diagram shown in FIG. 5 and with reference to FIGS. 1 through 4. First, it will be noted that the two clock signals C1 and C2 are underlapped. Thus, the leading edge of second clock signal C2 begins after the trailing edge of first clock signal C1.

Evaluation stage 14 shown in FIGS. 1 and 2, and particularly evaluation logic 20, responds to first clock signal C1 to evaluate the signal shown as input EV in the figures. A positive evaluation of input EV allows evaluation node 23 to go to ground, resulting in a high level initial signal IN at the output of inverter 24. The delay shown in FIG. 5 between initial signal IN and first clock signal C1 arises from the propagation delay through evaluation stage 14. As used in this description and the following claims, "providing" or "producing" a signal means generating a desired signal state. In the case of evaluation stage 14, providing initial signal IN means providing a high level signal since the signal is asserted at the logical "high" voltage level utilized by the particular circuitry.

Referring to FIGS. 3 and 5, initial signal IN is latched at first latch circuit 15 to produce first latch output signal L1 after a certain propagation delay through the latch circuit. In particular, with the reset signal RE not asserted, the high level signal IN at input transistor 29 allows that device to conduct and take internal latch node 32 to ground. The low level at node 32 is latched as the signal is inverted at inverter 33 and fed back to maintain transistor 31 in a conductive state and transistor 30 in a nonconductive state. The high level first latch circuit output signal L1 is developed by inverting the signal at node 32 through output inverter 34.

Referring now to FIGS. 4 and 5, the high level first latch circuit output signal L1 is applied immediately to control latch circuit 16 but latched by the circuit only in response to a high level second clock signal C2. When clock C2 becomes active, that is, goes to a logical high level, internal node 40 falls to ground through N-type transistors 38 and 39. This low level signal at node 40 represents the reset control signal and is held low through N-type transistor 43 under the control of feedback inverter 41. The signal at node 40 is delayed through an even number of inverters, in this case inverters 45 and 46, to apply reset signal RE to first latch circuit 15. It will be noted that reset signal RE is asserted low. The low level RE signal drives node 32 in FIG. 3 high through P-type transistor 27, resulting in a low level or deasserted signal L1 after a certain propagation delay associated with inverters 45 and 46 and the first latch circuit itself. Although two inverters 45 and 46 are shown for purposes of example in the illustrated reset arrangement, it will be appreciated that the number of inverters may be modified as desired to provide the desired delay in signal RE. Also, other types of delay circuitry could be employed alternatively to inverters. Where inverters are employed in producing the desired delay, an even number of inverters must be used to ensure that reset signal RE is not inverted with respect to the reset control signal appearing at node 40.

Although reset signal RE resets first latch circuit 15 to deassert first latch circuit output signal L1, the signal at node 40 in FIG. 4 remains low even after signal L1 is deasserted since the second clock signal C2 remains active to control transistors 37 and 39 and since feedback inverter 41 continues to control transistors 42 and 43. Thus, control latch circuit 16 continues to provide a high level or active control output signal L2 through inverter 48 even after signal L1 is deasserted. As indicated in FIG. 5, the high level control output signal L2 appears after a propagation delay associated with latch circuit 16 and remains stable throughout the duration of second clock signal C2. This propagation delay is less than that associated with the reset signal RE through inverters 45 and 46, and therefore, control output signal L2 becomes active before signal L1 is deasserted.

Control output signal L2 may be used directly to control the controlled circuit portion 12 of self-timed circuit 10 shown in FIG. 1, depending upon the requirements of the circuit portion 12. However, the preferred form of the invention may control circuit portion 12 through fast path circuit 17, shown in detail in FIG. 4. Referring to FIGS. 4 and 5, fast path circuit 17 provides an OR operation on its two inputs so that fast path circuit output signal FP goes active or is asserted high whenever either of its inputs L1 and L2 comprises a high level signal. Signal FP remains active until neither of the inputs L1 and L2 is active. Thus, fast path circuit output signal FP first goes active in response to the first latch circuit output signal L1. Although first latch circuit output signal L1 is removed in response to reset signal RE, signal FP remains asserted due to the presence of control output signal L2 and is deasserted only after signal L2 goes low after clock signal C2 goes low. Signal FP therefore remains active for a time period which begins during first clock signal Ci and continues throughout the term of second clock signal C2. In the example of the sense amplifier self-timed circuit illustrated in FIG. 1, this characteristic of fast path output signal FP allows sense amplifier circuit 18 to evaluate early and stabilize before the data is latched in response to second clock signal C2.

The above described preferred embodiments are intended to illustrate the principles of the invention, but not to limit the scope of the invention. Various other embodiments and modifications to these preferred embodiments may be made by those skilled in the art without departing from the scope of the following claims. For example, the circuit may be implemented with signals asserted at different logical states. Also, the circuit is not restricted to the illustrated CMOS circuitry shown in the figures for purposes of example.

What is claimed is:

1. A reset signal apparatus for use in controlling a reset in a self-timed circuit used in a multiple-clock system, the multiple-clock system utilizing a first clock signal to initiate the operation of the self-timed circuit and further utilizing a second clock signal which is delayed with respect to the first clock signal, the reset signal apparatus comprising:

(a) a first latch circuit for latching an initial signal to produce a first latch output signal, the initial signal being produced in response to the first clock signal;

(b) a control latch circuit for latching the first latch circuit output in response to the second clock signal to produce a reset control signal; and (c) a reset arrangement for applying a reset signal to the first latch circuit in response to the reset control signal.

2. The apparatus of claim 1 wherein the control latch circuit further produces a control output signal in response to the second clock signal, the control output signal beginning during the second clock signal and continuing throughout the remainder of the second clock signal so as to be available for controlling a controlled portion of the self-timed circuit.

3. The apparatus of claim 2 further comprising:

(a) a fast path circuit connected to receive the control output signal and the first latch circuit output signal, the fast path circuit being adapted to produce a fast path output signal when at least one of the first latch circuit output signal and control output signal is active.

4. The apparatus of claim 3 wherein the fast path circuit comprises:

(a) circuit elements which together provide an OR operation on the control output signal and the first latch circuit output signal.

5. The apparatus of claim 2 wherein the reset arrangement includes:

(a) an even number of inverter circuits connected in series between an internal node of the control latch circuit and a reset input to the first latch circuit.

6. The apparatus of claim 5 wherein the first latch circuit comprises a feedback latch circuit.

7. The apparatus of claim 1 wherein the controlled portion of the self-timed circuit comprises a sense amplifier and wherein outputs from the sense amplifier are latched in response to the second clock signal.

8. An apparatus for providing a control signal in a multiple-clock system, the multiple-clock system utilizing a first clock signal and a second clock signal which is delayed with respect to the first clock signal, the apparatus comprising:

(a) an evaluation stage for producing an initial signal in response to the first clock signal;

(b) a first latch circuit connected to receive the initial signal and a reset signal, the first latch circuit being adapted to latch the initial signal to produce a first latch circuit output signal until reset by the reset signal;

(c) a control latch circuit connected to receive the first latch circuit output signal from the first latch circuit and further connected to receive the second clock signal, the control latch circuit responding to the second clock signal to latch the first latch circuit output signal and produce both a reset control signal and a control output signal, the control output signal beginning during the second clock signal and remaining stable throughout the remainder of the second clock signal; and (d) a reset arrangement associated with the control latch circuit for producing the reset signal in response to the reset control signal.

9. The apparatus of claim 8 further comprising:

(a) a fast path circuit connected to receive the control output signal and the first latch circuit output signal, the fast path circuit being adapted to produce a fast path output signal when at least one of the first latch circuit output signal and control output signal is active.

10. The apparatus of claim 9 wherein the fast path output signal is stable during a period beginning during the first clock signal and continuing throughout the duration of the second clock signal.

11. The apparatus of claim 9 wherein the fast path circuit comprises:

(a) circuit elements which together provide an OR operation on the control output signal and the first latch circuit output signal.

12. The apparatus of claim 8 wherein the first latch circuit comprises a feedback latch circuit.

13. The apparatus of claim 8 wherein the control output signal is used to control a sense amplifier and wherein outputs from the sense amplifier are latched by the second clock signal.

14. A method for use in controlling a reset in a self-timed circuit included in a multiple-clock system, the multiple-clock system utilizing a first clock signal to initiate the operation of the self-timed circuit and further utilizing a second clock signal which is delayed with respect to the first clock signal, the method comprising the steps of:

(a) producing a first latch circuit output signal in response to the first clock signal;

(b) latching the first latch circuit output signal in response to the second clock signal to produce a reset control signal and a control output signal; and (c) resetting the first latch circuit in response to the reset control signal.

15. The method of claim 14 further comprising the step of maintaining the control output signal in a substantially stable state beginning during the second clock signal and throughout the remainder of the second clock signal.

16. The method of claim 14 wherein the control output signal is applied directly to control another circuit.

17. The method of claim 14 further comprising the step of:

(a) producing a fast path output signal when at least one of the first latch circuit output signal and control output signal is active.

18. The method of claim 17 wherein the step of producing the fast path output signal comprises the steps of:

(a) ORing the control output signal and the first latch circuit output signal.

19. The method of claim 17 further comprising the step of:

(a) applying the fast path output signal to control another circuit.

20. The method of claim 19 wherein the other circuit comprises a sense amplifier and wherein outputs from the sense amplifier are latched by the second clock signal.

* * * * *